(12) United States Patent
Hiraishi et al.

(10) Patent No.: US 6,578,764 B1
(45) Date of Patent: Jun. 17, 2003

(54) METHOD OF CONTROLLING MANUFACTURING PROCESS OF PHOTOELECTRIC CONVERSION APPARATUS

(75) Inventors: Masafumi Hiraishi, Shiga (JP); Kazunori Sawai, Shiga (JP)

(73) Assignee: Kaneka Corporation, Osaka (JP)

( * ) Notice: Subject to any disclaimer, the term of this patent is extended or adjusted under 35 U.S.C. 154(b) by 0 days.

(21) Appl. No.: 09/521,193

(22) Filed: Mar. 7, 2000

(30) Foreign Application Priority Data

Sep. 28, 1999 (JP) .......................... 11-274907
Oct. 6, 1999 (JP) .......................... 11-285664

(51) Int. Cl.⁷ .............................. G06F 7/10
(52) U.S. Cl. ...................... 235/454; 235/494
(58) Field of Search .................. 235/454, 494

(56) References Cited

U.S. PATENT DOCUMENTS 5,691,527 A    11/1997   Hara et al.
6,179,207 B1 *  1/2001   Bossen et al. ......... 235/467.01

FOREIGN PATENT DOCUMENTS

| EP | 0850779 A1 | 7/1998 |
| JP | 4-51156 | 4/1992 |
| JP | 8-180125 | 7/1996 |
| JP | 10-235480 | 9/1998 |

\* cited by examiner

*Primary Examiner*—Harold I. Pitts
(74) *Attorney, Agent, or Firm*—Hogan & Hartson, L.L.P.

(57) ABSTRACT

Disclosed is a method of controlling a manufacturing process of a photoelectric conversion apparatus, comprising putting a mark for controlling the manufacturing process in a peripheral region on a surface of a transparent substrate or in that region of a side surface of the transparent substrate, which is not irradiated with the laser beam used for the laser-scribing of each of a transparent electrode layer, a semiconductor layer and a reverse electrode layer, the mark being read in the subsequent process and the subsequent process being controlled by utilizing the mark thus read.

15 Claims, 1 Drawing Sheet

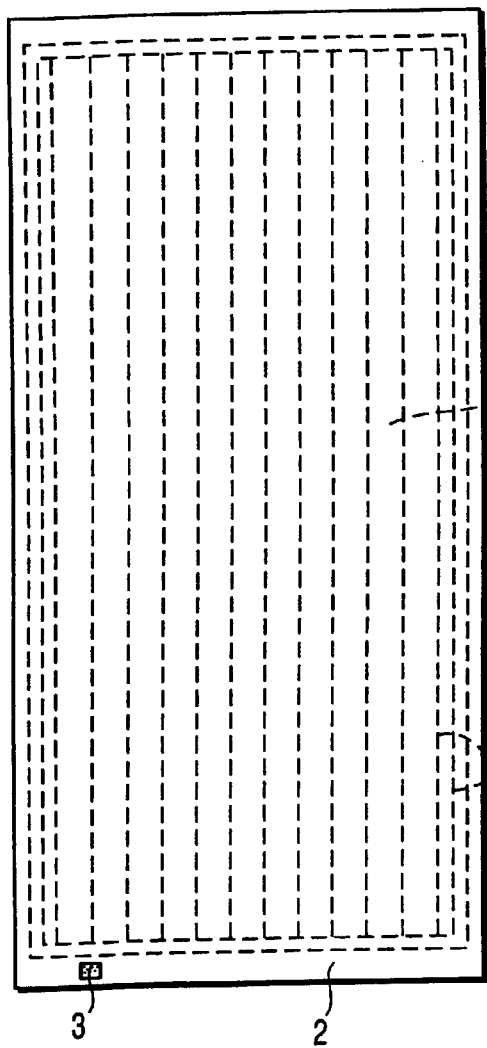
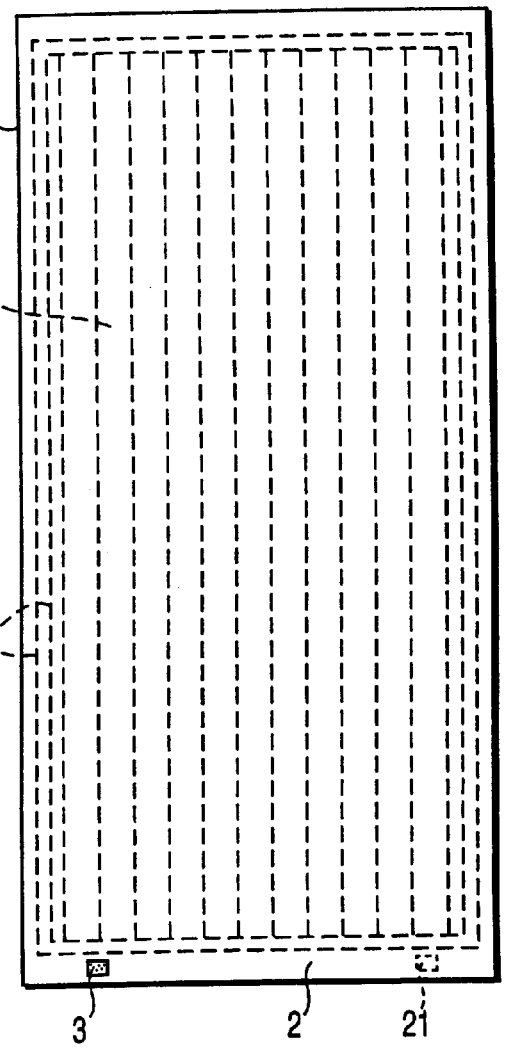
FIG. 1  FIG. 3
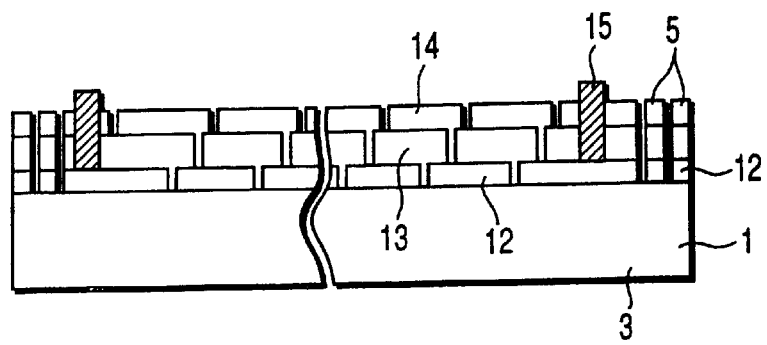
FIG. 2

METHOD OF CONTROLLING MANUFACTURING PROCESS OF PHOTOELECTRIC CONVERSION APPARATUS

CROSS-REFERENCE TO RELATED APPLICATIONS

This application is based upon and claims the benefit of priority from the prior Japanese Patent Applications No. 11-274907, filed Sep. 28, 1999; and No. 11-285664, filed Oct. 6, 1999, the entire contents of which are incorporated herein by reference.

BACKGROUND OF THE INVENTION

The present invention relates to a method of controlling a manufacturing process of a photoelectric conversion apparatus, particularly, to a method of controlling a manufacturing process of a photoelectric conversion apparatus that permits performing the process control easily and promptly.

In manufacturing a solar cell having a thin film semiconductor layer as a photoelectric semiconductor layer, a transparent electrode layer, a semiconductor layer and a reverse electrode layer formed in a laminated fashion on, mainly, a glass substrate. Each of these layers is scribed when formed. When the uppermost reverse electrode layer is scribed, a plurality of solar cells are formed. Further, these solar cells are electrically connected to manufacture a solar cell module.

As described above, a large number of film-forming processes, scribing processes, washing processes, etc. are involved in the manufacture of a solar cell module. It is necessary to perform these processes under predetermined conditions. Also, these processes must be performed under different conditions in order to manufacture solar cell modules of different specifications such as the size and shape.

In order to manufacture a large number of solar cell modules of different specifications on a mass production basis by performing various processes under different conditions, it is necessary to control each manufacturing process consistently.

It should also be noted that the I-V characteristics, the insulation resistance characteristics, the breakdown voltage characteristics, etc. of the solar cell module as manufactured are measured for inspecting the solar cell module. It is necessary to control consistently the results of the inspection and the individual solar cell module.

However, a system for consistently controlling the manufacturing process of a solar cell module and the results of the inspection has not yet been developed, making it important to develop such a system.

BRIEF SUMMARY OF THE INVENTION

An object of the present invention is to provide a method of controlling the manufacturing process of a photoelectric conversion apparatus that makes it possible to control consistently the manufacturing process of a photoelectric conversion apparatus and the results of the inspection.

As a result of an extensive research conducted in an attempt to achieve the above-noted object, the present inventors have found that it is effective to put a mark at a predetermined position on the surface of a substrate before the film formation and scribing steps such that the mark is read in the subsequent steps so as to control all the subsequent steps.

Particularly, it is effective to put a first mark resistant to the subsequent steps at a predetermined position of the substrate such that the subsequent steps are controlled by reading the first mark and, then, to put a cheap second mark excellent in visibility such that the values denoting the characteristics of the apparatus are controlled on the basis of the second mark. In other words, it has been found that the quality of the photoelectric conversion apparatus can be controlled consistently by using two different marks. Of course, the present invention has been achieved on the basis of these findings.

According to a first aspect of the present invention, there is provided a method of controlling the manufacturing process of a photoelectric conversion apparatus, the manufacturing process comprising the step of successively forming a transparent electrode layer, a semiconductor layer and a reverse electrode layer in a laminated fashion on one surface of a transparent substrate, laser-scribing each of these layers as formed to form a plurality of solar cells, electrically connecting these solar cells to form a solar cell module, laser-scribing the peripheral portion of the transparent substrate of the solar cell module to electrically separate the power generation region of the solar cell module from the peripheral region to obtain a photoelectric conversion apparatus, and inspecting the resultant photoelectric conversion apparatus, wherein the controlling method comprises the step of putting a mark for controlling the manufacturing process in a peripheral region on the other surface of the transparent substrate or in that region of a side surface of the transparent substrate, which is not irradiated with the laser beam used for the laser-scribing of each of the transparent electrode layer, the semiconductor layer and the reverse electrode layer, the mark being read in the subsequent process and the subsequent process being controlled by utilizing the mark thus read.

According to a second aspect of the present invention, there is provided a quality controlling system using a mark, comprising means for putting a first mark on a surface of a transparent substrate in the process of manufacturing a photoelectric conversion apparatus, means for controlling the subsequent step by utilizing the first mark put on the transparent substrate, means for putting a second mark on the transparent substrate, and means for controlling the subsequent step by utilizing the second mark put on the transparent substrate.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a plan view showing a solar cell module according to a first embodiment of the present invention;

FIG. 2 is a cross sectional view showing the solar cell module shown in FIG. 1; and FIG. 3 is a plan view showing the substrate surface of a solar cell module according to a second embodiment of the present invention.

DETAILED DESCRIPTION OF THE INVENTION

In the present invention, a mark is put in a predetermined position on the surface of a substrate before the film formation and scribing steps such that the mark is read in the subsequent step so as to make it possible to control all the subsequent steps.

In the method of the present invention for controlling the manufacturing process, a mark is put in a peripheral region, which is 5 mm wide, on that surface of a transparent substrate which is opposite to the film forming surface of the transparent substrate. Alternatively, the mark can be put on the side surface in place of the upper surface of the transparent substrate. Where the mark is put on the side surface, the mark can be easily read even where a plurality of transparent substrates are superposed one upon the other. The mark can also be put in some cases on the reverse surface of the transparent substrate.

A bar code or a two-dimensional code can be used as the mark. The bar code is a one-dimensional code having information in only the horizontal direction (lateral direction). On the other hand, the two-dimensional code has information in both the horizontal and vertical directions and, thus, is capable of storing data scores of to hundreds of times as much as the data stored in the bar code. It follows that the two-dimensional code can be used preferably in the present invention as a mark for controlling the manufacturing process in manufacturing solar cells of various specifications on a mass production basis.

There are various types of two-dimensional codes including a stacked type in which bar codes are stacked one upon the other in multi-stages and a matrix type having a check pattern. In the present invention, a suitable two-dimensional code can be selected from among these various types.

The two-dimensional code has a tremendous data storing capacity as pointed out above. In addition, the two-dimensional code has various merits. For example, the two-dimensional code permits a high density printing, permits correcting errors, permits information reading even if the code is partly broken or stained, and also permits information reading in all directions of 360°. Such being the situation, the two-dimensional code is particularly adapted for use in the control of the manufacturing process of a solar cell that is performed under various environments.

In addition to the bar code and the two-dimensional code, a numeral, a character or a combination thereof can also used as a mark. For example, the substrate number can be presented by combination of a two-dimensional code and a numeral.

The mark can be imparted by carving with laser or by printing. In the case of employing the printing, it is necessary to use a material that is not removed in the washing step with a detergent after the scribing step and is resistant to the heating step such as a CVD process or an annealing process. The materials meeting these requirements include, for example, a pigment-based ink, a dye-based ink and metal films made of aluminum, silver or chromium.

The printing method includes, for example, an ink jet printing method, a transfer printing method using a laser beam and a thermal transfer printing system.

The mark can be read by, for example, a laser system or a CCD line sensor system.

In the method of the present invention described above for controlling the manufacturing process of a photoelectric conversion apparatus, a small mark is simply put in a predetermined position on the surface of the transparent substrate before the film formation and scribing step. What should be noted is that it is possible to control all the subsequent manufacturing process and the product quality by simply reading the mark in the subsequent process. It follows that the control of the manufacturing process and the product quality, which is indispensable in the mass production of photoelectric conversion apparatuses of various specifications, can be performed easily and promptly without requiring costly facilities.

Further, the front surface or reverse surface of the substrate can be easily recognized by the presence or absence of the mark.

In the method of the present invention described above for controlling the manufacturing process of a photoelectric conversion apparatus, it is possible to use the mark described above as a first mark excellent in resistance to the process for controlling the process before the encapsulating and to use a second mark cheap and excellent in visibility for controlling the process after the encapsulating. In other words, the present invention can be applied to a quality controlling system using two kinds of marks.

To be more specific, in the quality controlling system of the present invention, a first mark is put on that region of a peripheral region on the other surface or on the side surface of the substrate which is not irradiated with a laser beam used for the laser scribing, and the first mark thus put is read in the subsequent process for controlling the subsequent process. Then, a second mark is put for controlling the values denoting the characteristics of the apparatus. In short, the present invention makes it possible to control consistently the quality of the photoelectric conversion apparatus by using the two marks differing from each other.

It is desirable for the first mark used in the quality controlling system of the present invention to have a resistance to the subsequent process. To be more specific, it is desirable for the first mark to be put by printing such that the first mark is not removed in the washing step using a detergent and performed after the scribing step.

As described previously, the printing method employed in the present invention includes a method of transferring a metal film made of chromium or silver by using a laser and a method of vapor-depositing a metal by using a laser.

The position where the first mark is put, the kind of the first mark and the reading system are as already described herein. However, the position where the first mark used in the quality controlling system of the present invention is put is not necessarily limited to a region that is not irradiated with the laser beam used for the laser scribing.

It is desirable for the second mark to be formed at a low cost and to be excellent in visibility. To be more specific, it is possible to attach the second mark to the reverse surface of the substrate after completion of the thin film treating step. Therefore, it is desirable for the second mark to be obtained easily. For example, a label having at least one kind selected from the group consisting of a bar code, a character and a numeral printed thereon can be attached to the substrate as the second mark.

Incidentally, it is necessary to employ a material and an attaching method that do not adversely affect the manufacturing process such that impurities are not generated from the attached second mark such as a two-dimensional code in the vacuum process such as a CVD step and a sputtering step.

In the quality controlling system of the present invention described above, a mark is put at a predetermined position on the surface of the substrate before the film formation and the scribing step, and the mark is read in the subsequent process so as to control all the steps in the subsequent process.

Some embodiments of the present invention will now be described with reference to the accompanying drawings.

Specifically, FIG. 1 is a plan view showing the front surface, which is irradiated with the solar light, of a solar cell module according to the first embodiment of the present invention. As shown in the drawing, a mark, e.g., a two-dimensional code 3, is put in a peripheral region 2 on the front surface of a solar cell module 1. It should be noted that a semiconductor layer and a reverse electrode layer are formed successively on the reverse surface of the solar cell module 1, followed by coating the reverse electrode layer with a resin. Therefore, if the two-dimensional code 3 is put on the reverse surface of the solar cell module 1, it is difficult to read the two-dimensional code 3 and, thus, the code 3 is put on that region of the front surface which is irradiated with the solar light.

The peripheral region 2 is a region positioned outside a plurality of separating grooves 5, i.e., generally 4 separating grooves, though two separating grooves are shown in the drawing. The peripheral region 2 is electrically separated from a power generating region 4 by the separating grooves 5. In general, the peripheral region 2 has a width of 5 mm as measured from the periphery of the solar cell module 1.

The peripheral region 2 in which the two-dimensional code 3 is put does not contribute to the power generation and, thus, does not affect the power generation. Also, the peripheral region 2 is not irradiated with a laser beam used for the laser scribing in the manufacturing process described below of the solar cell module 1.

The two-dimensional code 3 is put in the region that is not irradiated with a laser beam. If the two-dimensional code 3 is irradiated with a laser beam, the two-dimensional code is damaged, resulting in failure to read the two-dimensional code 3. It follows that the control of the manufacturing process is adversely affected. It should also be noted that the laser beam is intercepted by the two-dimensional code 3, with the result that the laser scribing is adversely affected.

In the manufacturing process of a solar cell module, the laser scribing is performed in the scribing step of the transparent electrode layer, the scribing step of the semi-conductor layer, the scribing step of the reverse electrode layer, and in the scribing step for separating the power generation region from the peripheral region. After the scribing step, it is possible for a washing step using a detergent to be performed.

The two-dimensional code 3 is used for controlling the subsequent manufacturing process. Therefore, the two-dimensional code 3 is put to the glass substrate before the glass substrate is subjected to the manufacturing process, or to the glass substrate in the stage of the initial manufacturing process, e.g., the glass substrate on which the transparent electrode layer is formed.

The glass substrate having the two-dimensional code 3 put thereon is used in the various subsequent steps including, for example, the step of forming a transparent electrode layer and scribing the transparent electrode layer thus formed, the step of forming a semiconductor layer and scribing the semiconductor layer thus formed, the step of forming a reverse electrode layer and scribing the reverse electrode layer thus formed, the scribing step for separating the power generation region from the peripheral region, the encapsulating and the inspecting step. An apparatus for reading the two-dimensional code is arranged for some or all of these steps. As a result, the two-dimensional code 3 put to the glass substrate is read by the apparatus for reading the two-dimensional code, thereby controlling each manufacturing step.

Each step of the process for manufacturing an integrated thin film solar cell according to the first embodiment of the present invention will now be described with reference to FIG. 2.

In the first step, a film of a transparent metal oxide having an electrical conductivity such as tin oxide ($SnO_2$), indium tin oxide (ITO) or zinc oxide (ZnO) is formed on a transparent substrate 1 such as a glass substrate. In this case, the two-dimensional code 3 is put by a predetermined method, e.g., by using a metal transfer marker, to a predetermined position on the surface of the glass substrate 1 before formation of the metal oxide film or to a predetermined position on the surface of the glass substrate 1 after formation of the metal oxide film. In the process after the two-dimensional code 3 has been put, the two-dimensional code 3 is read by a predetermined method so as to control the subsequent process. It is possible for the two-dimensional code 3 to represent, for example, the substrate number.

When the two-dimensional code 3 is printed on the substrate 1, additional data such as the date when the substrate was used and the substrate lot number are stored in a server connected to the metal transfer marker.

In the next step, the metal oxide film formed on the substrate is subjected to a laser-scribing so as to form on substantially the entire surface of the substrate a plurality of strip-like first electrode layers 12 extending in one direction of the substrate and separated from each other by a separating band interposed between the adjacent strips of the first electrode layer 12.

In the next step, three layers consisting of a p-type hydrogenated amorphous silicon carbide layer (p-type a-SiC:H), an i-type hydrogenated amorphous silicon layer (i-type a-Si:H) and an n-type hydrogenated amorphous silicon layer (n-type a-Si:H) are deposited successively on the first electrode layer by a plasma CVD method to form a semiconductor layer 13.

Then, the semiconductor layer is partly removed by a laser scribing to form an opening portion for an electric connection. In this stage, a single semiconductor layer 13 is constructed to bridge two adjacent first electrode layers 12. After the laser scribing step, a two dimensional code reader is arranged to permit the two dimensional code put to the passing substrate to be read by the reader. At the same time, the information on the processing series and the processing data and time are added to the server.

In the next step, a second electrode layer 14 made of a metal such as aluminum (Al) or silver (Ag) is formed on the plural semiconductor layer regions 13. Further, a separating groove is formed by removing at least partly the second electrode layer by laser scribing along the opening for the electric connection.

Then, the second electrode layer and the semiconductor layer in the lead-out electrode portion in the vicinity of the connection terminal are removed by laser scribing. Also, the second electrode layer, the semiconductor layer and the first electrode layer on the outside thereof are removed by laser scribing to form a plurality of separating grooves 5 for separating the power generating region from the peripheral region.

A two-dimensional code reader is also arranged after the laser scribing step to permit the two-dimensional code put to the passing substrate to be read by the reader. Also, the information on the processing series and the processing date and time are added to the server.

In the next step, a conductor 15 such as a solder-plated copper foil is mounted to the lead-out electrode portion of the first electrode by a bonding material such as an ultrasonic solder or an adhesive such as a conductive resin so as to permit the first electrode layer 12 to be electrically connected to the conductor 15. As a result, the conductor 15 functions as a lead-out electrode. Manufacture of a solar cell is finished by mounting the lead-out electrode, though it is possible for the solar cell to be coated with, for example, an encapsulant resin, and a frame member is mounted around the substrate, as required.

Finally, the I-V characteristics and the insulation resistance of the solar cell thus prepared are measured so as to inspect whether or not the solar cell exhibits desired characteristics. In the inspecting process, the two-dimensional code put to the substrate is read, and the information on the measured values are recorded together with the information on the substrate and the information of each manufacturing step so as to control consistently the manufacturing process and the product quality. Specifically, where the measured value does not fall within a predetermined range, the history of the product can be known easily, and it is possible to clarify the cause of the failure for the measured value to fall within the predetermined range.

As described above, in the present invention, a fine mark is simply put to a predetermined position on the surface of a transparent substrate, thereby making it possible to control all the subsequent manufacturing process and the product quality by simply reading the mark in the subsequent process. It follows that the control of the manufacturing process and the product quality, which are absolutely necessary in the mass production of photoelectric conversion apparatuses of various specifications, can be performed easily and promptly without using a costly facility. In addition, the front surface or reverse surface of the substrate can be known easily on the basis of the presence or absence of the mark.

A second embodiment of the present invention will now be described with reference to FIG. 3.

Specifically, FIG. 3 is a plan view showing the front surface, which is irradiated with the solar light, of a solar cell module 1 according to the second embodiment of the present invention. A first mark, e.g., a two-dimensional code 3, is put on the peripheral region 2 on the front surface of the solar cell module 1, as in the first embodiment. As described previously in conjunction with the first embodiment, a semiconductor layer and a reverse electrode layer are formed successively on the back surface of the solar cell module 1, followed by coating the reverse electrode layer with a resin. Therefore, if the two-dimensional code 3 is put on the reverse surface of the solar cell module 1, it is difficult to read the two-dimensional code 3 and, thus, the code 3 is put on that region of the front surface which is irradiated with the solar light.

The peripheral region 2 is a region positioned outside a plurality of separating grooves 5, i.e., generally 4 separating grooves, though two separating grooves are shown in the drawing. The peripheral region 2 is electrically separated from a power generating region 4 by the separating grooves 5. In general, the peripheral region 2 has a width of 5 mm as measured from the periphery of the solar cell module 1.

The peripheral region 2 in which the two-dimensional code 3 is put does not contribute to the power generation and, thus, does not affect the power generation. Also, the peripheral region 2 is not irradiated with a laser beam used for the laser scribing in the manufacturing process described below of the solar cell module 1.

The two-dimensional code 3 is put in the region that is not irradiated with a laser beam. If the two-dimensional code 3 is irradiated with a laser beam, the two-dimensional code is damaged, resulting in failure to read the two-dimensional code 3. It follows that the control of the manufacturing process is adversely affected. It should also be noted that the laser beam is intercepted by the two-dimensional code 3, with the result that the laser scribing is adversely affected. Incidentally, in the case of using a mark that is not damaged by the irradiation with a laser beam, it is possible to put the first mark in the region irradiated with the laser beam in the laser scribing step during manufacture of the solar cell module 1.

In the manufacturing process of a solar cell module, the laser scribing is performed in the scribing step of the transparent electrode layer, the scribing step of the semiconductor layer, the scribing step of the reverse electrode layer, and in the scribing step for separating the power generation region from the peripheral region. After the scribing step, it is possible for a washing step using a detergent to be performed.

The two-dimensional code 3 is used for controlling the subsequent manufacturing process. Therefore, the two-dimensional code 3 is put to the glass substrate before the glass substrate is subjected to the manufacturing process, or to the glass substrate in the stage of the initial manufacturing process, e.g., the glass substrate on which the transparent electrode layer is formed.

The glass substrate having the two-dimensional code 3 put thereon is used in the various subsequent steps including, for example, the step of forming a transparent electrode layer and scribing the transparent electrode layer thus formed, the step of forming a semiconductor layer and scribing the semiconductor layer thus formed, the step of forming a reverse electrode layer and scribing the reverse electrode layer thus formed, the scribing step for separating the power generation region from the peripheral region, and the step for mounting a lead. An apparatus for reading the two-dimensional code is arranged for some or all of these steps. As a result, the two-dimensional code 3 put to the glass substrate is read by the apparatus for reading the two-dimensional code, thereby controlling each manufacturing step.

The information read by the reading apparatus is put to the reverse surface of the substrate as a second mark 21 in the form of a bar code or a character printed on, for example, a bar code label. To be more specific, in the inspecting process, the information of the second mark 21 is printed again on a bar code label and, then, the label is attached to the reverse surface of the substrate for transfer to the subsequent step. Alternatively, a label having the product number printed thereon is attached to the reverse surface of the substrate to obtain the final product and, then, the final product is stored in a warehouse.

The second mark 21 can be put to the substrate by simply attaching a label having, for example, a bar code printed thereon to the reverse surface of the substrate and, thus, can be a cheap mark, compared with the first mark, e.g., a two-dimensional mark that is printed directly on the surface of the substrate. In addition, the second mark does not necessitate a costly reading apparatus that is required in the case of using a two-dimensional mark. Further, the second mark can be made larger in size than the first mark and, thus, is excellent in visibility.

As described above, in the second embodiment of the present invention, two kinds of marks are used optionally depending on the stages of the manufacturing process so as to control with a computer the information owned by these marks and the information such as the processing date and time of each step, the number of the series of the products, the measured data and the rank (judgment). It follows that the manufacturing process of the solar cell and the quality of the product can be controlled consistently and efficiently.

Each step of the process for manufacturing an integrated thin film solar cell according to the second embodiment of the present invention will now be described with reference to FIG. 2.

In the first step, a film of a transparent metal oxide having an electrical conductivity such as tin oxide ($SnO_2$), indium tin oxide (ITO) or zinc oxide (ZnO) is formed on a transparent substrate 1 such as a glass substrate. In this case, the two-dimensional code 3 is put by a predetermined method, e.g., by using a metal transfer marker, to a predetermined position on the surface of the glass substrate 1 before formation of the metal oxide film or to a predetermined position on the surface of the glass substrate 1 after formation of the metal oxide film. It is possible for the two-dimensional code 3 to contain various information such as the manufactures and kind of the substrate and the substrate lot number in addition to the substrate number.

In the process after the two-dimensional code 3 has been put, the two-dimensional code 3 is read by a predetermined method so as to control the subsequent process.

In the next step, the metal oxide film formed on the substrate is subjected to a laser-scribing so as to form on substantially the entire surface of the substrate a plurality of strip-like first electrode layers 12 extending in one direction of the substrate and separated from each other by a separating band interposed between the adjacent strips of the first electrode layer 12.

In the next step, three layers consisting of a p-type hydrogenated amorphous silicon carbide layer (p-type a-SiC:H), an i-type hydrogenated amorphous silicon layer (i-type a-Si:H) and an n-type hydrogenated amorphous silicon layer (n-type a-Si:H) are deposited successively on the first electrode layer to form a semiconductor layer 13.

Then, the semiconductor layer is partly removed by a laser scribing to form an opening portion for an electric connection. In this stage, a single region of the semiconductor layer 13 is constructed to bridge two adjacent first electrode layers 12. After the laser scribing step, a two dimensional code reader is arranged to permit the two dimensional code put to the passing substrate to be read by the reader. At the same time, the information on the processing series and the processing data and time are added to the server.

In the next step, a second electrode layer 14 made of a metal such as aluminum (Al) or silver (Ag) is formed on the plural semiconductor layer regions 13. Further, a separating groove is formed by removing at least partly the second electrode layer by laser scribing along the opening for the electric connection.

Then, the second electrode layer and the semiconductor layer in the lead-out electrode portion in the vicinity of the connection terminal are removed by laser scribing. Also, the second electrode layer, the semiconductor layer and the first electrode layer on the outside thereof are removed by laser scribing to form a plurality of separating grooves 5 for separating the power generating region from the peripheral region.

A two-dimensional code reader is also arranged after the laser scribing step to permit the two-dimensional code put to the passing substrate to be read by the reader. Also, the information on the processing series and the processing date and time are added to the server.

In the next step, a conductor 15 such as a solder-plated copper foil is mounted to the lead-out electrode portion of the first electrode by a bonding material such as an ultrasonic solder or an adhesive such as a conductive resin so as to permit the first electrode layer 12 to be electrically connected to the conductor 15. As a result, the conductor 15 functions as a lead-out electrode.

After formation of the lead-out electrode, a two-dimensional code reader is arranged to permit the two-dimensional code put to the passing substrate to be read by the two-dimensional code reader. The substrate number that has been read is printed on a bar code label 21 in the form of a bar code or a character together with the abbreviated symbol of the kind and rank of the substrate. After the printing, the bar code label 21 is attached to an edge portion on the reverse surface of the substrate, as shown in FIG. 3.

Then, the solar cell is sealed by coating, for example, an encapsulant resin. After the sealing, the I-V characteristics and the insulation resistance of the solar cell are measured to inspect whether or not the solar cell exhibits desired characteristics. In this step, the bar code is read from the bar code label 21, and the measured data are added to the server.

After the inspecting step, the product number is printed in the form of a character on a label, and the label is attached to an edge portion on the reverse surface of the substrate so as to finish manufacture of the solar cell module. The solar cell module thus manufactured is stored in a warehouse.

As described above, in the quality controlling system according to the second embodiment of the present invention, the manufacturing process before the encapsulating is controlled by a mark put in an edge portion on the front surface of the substrate and excellent in resistance to the subsequent process, e.g., a two-dimensional code. Also, the manufacturing process after the encapsulating is controlled by a mark put in an edge portion on the reverse surface of the substrate, which is cheap and excellent in visibility. The mark consists of, for example, a bar code.

The information contained in these two kinds of marks and read out in each step is processed together with the information input in each step, making it possible to control consistently the manufacturing process and the product quality of the photoelectric conversion apparatus.

As described above in detail, in the second embodiment of the present invention, two kinds of marks are used optionally depending on the stages of the manufacturing process so as to control with a computer the information owned by these marks and the information such as the processing date and time of each step, the number of the series of the products, the measured data and the rank (judgment). It follows that the manufacturing process of the solar cell and the quality of the product can be controlled consistently and efficiently.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of controlling the manufacturing process of a photoelectric conversion apparatus, said manufacturing process comprising the steps of successively forming a transparent electrode layer, a semiconductor layer and a reverse electrode layer in a laminated fashion on one surface of a transparent substrate, laser-scribing each of these layers as formed to form a plurality of solar cells, electrically connecting these solar cells to form a solar cell module, laser-scribing the peripheral portion of the transparent substrate of the solar cell module to electrically separate the power generation region of the solar cell module from the peripheral region to obtain a photoelectric conversion apparatus, and inspecting the resultant photoelectric conversion apparatus, wherein said controlling method comprises the step of putting a mark for controlling the manufacturing process in a peripheral region on an another surface of said transparent substrate or in that region of a side surface of the transparent substrate, which is not irradiated with the laser beam used for the laser-scribing of each of the transparent electrode layer, the semiconductor layer and the reverse electrode layer, said mark being read in the subsequent process and the subsequent process being controlled by utilizing the mark thus read.

2. The method according to claim 1, wherein said mark is put in a peripheral region of said transparent substrate, said peripheral region having a width of 5 mm as measured from the periphery of the transparent substrate.

3. The method according to claim 1, wherein said mark consists of a bar code or a two-dimensional mark.

4. The method according to claim 1, wherein said mark is formed by laser carving.

5. The method according to claim 1, wherein said mark is formed by printing.

6. The method according to claim 1, wherein said mark is at least one kind selected from the group consisting of a two-dimensional code, a bar code, a character, and a numeral formed by direct printing on the surface of the substrate.

7. The method according to claim 1, wherein said mark is read for controlling each of the subsequent manufacturing steps and, then, another mark is put on the transparent substrate for controlling the subsequent steps by utilizing said another mark.

8. The method according to claim 7, wherein said mark has resistance to the subsequent steps.

9. The method according to claim 7, wherein said another mark is excellent in visibility.

10. The method according to claim 7, wherein said another mark is at least one kind selected from the group consisting of a bar code, a character and a numeral that are printed on a label attached to the back surface of the substrate.

11. A quality controlling system using a mark, comprising:

means for putting a first mark on a surface of a transparent substrate in the process of manufacturing a photoelectric conversion apparatus;

means controlling the subsequent step by utilizing the first mark put on the transparent substrate;

means for putting a second mark on the transparent substrate; and means for controlling the subsequent step by utilizing the second mark put on the transparent substrate.

12. The quality controlling method according to claim 11, wherein said first mark has resistance to the subsequent step.

13. The quality controlling method according to claim 12, wherein said first mark is at least one kind selected from the group consisting of a two-dimensional code, a bar code, a character, and a numeral, which are formed by direct printing on the front surface of the substrate.

14. The quality controlling method according to claim 11, wherein said second mark is excellent in visibility.

15. The quality controlling method according to claim 14, wherein said second mark is at least one kind selected from the group consisting of a bar code, a character, and a numeral, which are printed on a label attached to the reverse surface of the substrate.

* * * * *